United States Patent
Su et al.

(10) Patent No.: US 10,862,432 B2
(45) Date of Patent: Dec. 8, 2020

(54) POWER CONTROL CIRCUIT AND POWER AMPLIFIER CIRCUIT

(71) Applicant: SMARTER MICROELECTRONICS (GUANG ZHOU) CO., LTD., Guangzhou (CN)

(72) Inventors: Qiang Su, Guangzhou (CN); Baiming Xu, Guangzhou (CN); Jiangtao Yi, Guangzhou (CN); Yang Li, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 0 days.

(21) Appl. No.: 16/411,095

(22) Filed: May 13, 2019

(65) Prior Publication Data

US 2019/0267948 A1   Aug. 29, 2019

Related U.S. Application Data

(63) Continuation of application No. PCT/CN2017/117145, filed on Dec. 19, 2017.

(30) Foreign Application Priority Data

Mar. 9, 2017 (CN) .......................... 2017 1 0139207

(51) Int. Cl.
  *H03F 1/02*   (2006.01)
  *G05F 1/10*   (2006.01)
  *G05F 1/66*   (2006.01)
  *H03F 3/21*   (2006.01)

(52) U.S. Cl.
  CPC ............. *H03F 1/0272* (2013.01); *G05F 1/10* (2013.01); *G05F 1/66* (2013.01); *H03F 1/0211* (2013.01); *H03F 3/21* (2013.01)

(58) Field of Classification Search
  CPC .... H03F 1/0272; H03F 3/21; H03F 2200/408; H03F 2200/516; H03F 3/19; H03F 3/245; G05F 1/10; G05F 1/66
  USPC ......................................... 330/136, 297, 285
  See application file for complete search history.

(56) References Cited

U.S. PATENT DOCUMENTS 8,531,240 B2 *  9/2013  Ubbesen .............. H03G 3/3047
                                                        330/127

* cited by examiner

*Primary Examiner* — Khanh V Nguyen
*Assistant Examiner* — Khiem D Nguyen
(74) *Attorney, Agent, or Firm* — Syncoda LLC; Feng Ma (57) ABSTRACT

A power control circuit includes a voltage control circuit and a current control circuit. The voltage control circuit is configured to detect an output power control signal that is inputted, convert the output power control signal into a control voltage and output the control voltage to the driver stage of a power amplifier connected to the power control circuit. The current control circuit is configured to detect an output power control signal that is inputted, convert the output power control signal into a control current and output the control current to the amplification stage of the power amplifier.

15 Claims, 5 Drawing Sheets

POWER CONTROL CIRCUIT AND POWER AMPLIFIER CIRCUIT

CROSS-REFERENCE TO RELATED APPLICATIONS

The present application is a continuation of, and claims priority to PCT/CN2017/117145 filed on Dec. 19, 2017, which in turn claims priority to Chinese Patent Application No. 201710139207.0, filed on Mar. 9, 2017. The disclosures of these applications are hereby incorporated by reference in their entirety.

BACKGROUND

At present, radio frequency power amplifiers have a wide range of applications in the field of communications, such as a power amplifier in a Global System for Mobile Communication (GSM) of a global 2nd Generation (2G) mobile communication technology. In a saturated operating mode, in order to meet the requirements of a 3rd Generation Partnership Project (3GPP) protocol for a Power Time Template (PVT) of the GSM output power in a time domain, an output power of the power amplifier is controlled by the voltage of an external output power control signal Vramp, and when a radio frequency signal input from a radio frequency input port RF IN is amplified and output by a radio frequency output port RF OUT, the commonly used implementation method is: controlling a collector voltage Vcc of a power amplifier with a closed loop circuit so that the collector voltage Vcc is directly proportional to the output power control signal Vramp, and the output power of the power amplifier changes with the output power control signal Vramp. This method is called a voltage control method.

Figure 1:
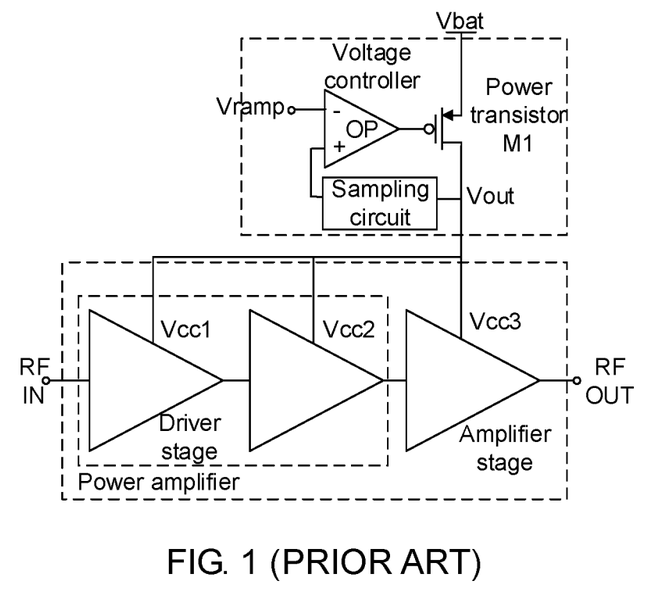
FIG. 1 is a schematic diagram showing a circuit structure of a power amplifier circuit in the related art.

In the voltage control method shown in FIG. 1, information about a value of a collector output voltage of a power transistor M1 is fed back to a positive input of a differential amplifier OP through a sampling circuit, and the collector output voltage is compared with the voltage of the output power control signal Vramp to obtain a difference. Then, the difference is used to drive the power transistor M1 to output a voltage Vout as a collector voltage of a power amplifier, where the collector voltage of the power amplifier is collector voltages Vcc1 and Vcc2 of a driver stage of the power amplifier and a collector voltage Vcc3 of an amplifier stage of the power amplifier. When the output power control signal Vramp increases, the collector output Vout of the power transistor M increases, the operating voltage of the power amplifier increases, and the output power increases. When the output power control signal Vramp decreases, the collector output Vout of the power transistor M decreases, and the output power of the power amplifier reduces.

SUMMARY

The disclosure relates to the technical field of electronics, and in particular to a power control circuit and a power amplifier circuit.

The inventors of the present disclosure have recognized that, when the voltage control method is used to control the output power of the power amplifier, since the output power of a saturated GSM power amplifier is relatively high and the operating current is large, a large-area power transistor M1 is required to meet the requirements on the current; furthermore, the voltage drop generated by the power transistor M1 directly affects the efficiency of the power amplifier.

In view of the above, the embodiments of the disclosure provide a power control circuit and a power amplifier circuit.

The embodiments of the disclosure provide a power control circuit, which may include a voltage control circuit and a current control circuit.

The voltage control circuit may be configured to detect an inputted output power control signal, convert the output power control signal into a control voltage, and output the control voltage to a driver stage of a power amplifier connected to the power control circuit.

The current control circuit may be configured to detect the inputted output power control signal, convert the output power control signal into a control current, and output the control current to an amplifier stage of the power amplifier.

In some embodiments, the control voltage may be output to each driver stage of the power amplifier comprising at least one driver stage.

In some embodiments, the voltage control circuit may include a first shaping circuit and a voltage regulator, the first shaping circuit and the voltage regulator being configured to convert the output power control signal into the control voltage.

In some embodiments, the control voltage output by the voltage control circuit may be positively correlated with a voltage of the inputted output power control signal when the output power control signal is greater than a preset first threshold and less than a preset second threshold.

In some embodiments, the voltage control circuit may further include a clamping circuit, configured to perform voltage clamp on the output power control signal when the output power control signal exceeds the preset second threshold.

In some embodiments, the current control circuit may include a voltage-to-current converter, an error amplifier and a power transistor.

The voltage-to-current converter may be configured to convert an input voltage into a first output current.

The error amplifier and the power transistor may be configured to convert the first output current into the control current.

In some embodiments, the first control current output by the voltage-to-current converter may be positively correlated with a voltage of the inputted output power control signal when the output power control signal is greater than a preset third threshold.

In some embodiments, the current control circuit may further include a second shaping circuit, configured to shape the output power control signal.

In some embodiments, the power control circuit may further include a resistor, wherein one end of the resistor is connected to a power supply, and the other end of the resistor is connected to a negative input of the error amplifier and a collector of the amplifier stage of the power amplifier.

The embodiments of the disclosure provide a power amplifier circuit, which may include a power amplifier and the power control circuit according to the above technical solution.

The power control circuit, connected to the power amplifier, may be configured to input a control voltage and a control current to the power amplifier.

The power amplifier may be configured to amplify an inputted radio frequency signal according to the control voltage and the control current, and output the amplified radio frequency signal.

According to the power control circuit and the power amplifier circuit provided by the embodiments of the disclosure, an input power control signal is converted into a control voltage and a control current respectively using a voltage control circuit and a current control circuit, and the control voltage and the control current are output respectively to a driver stage and an amplifier stage of a power amplifier so that the power amplifier is controlled to implement its radio frequency amplification function. Compared with related art, the collector current of the power transistor M1 reduces and the performance of the power amplifier circuit is improved.

DETAILED DESCRIPTION

In order to provide a more detailed understanding of the features and technical aspects of the disclosure, the implementation of the disclosure will be described in detail below with reference to the accompanying drawings, and the accompanying drawings are for illustrative purposes only.

Figure 2:
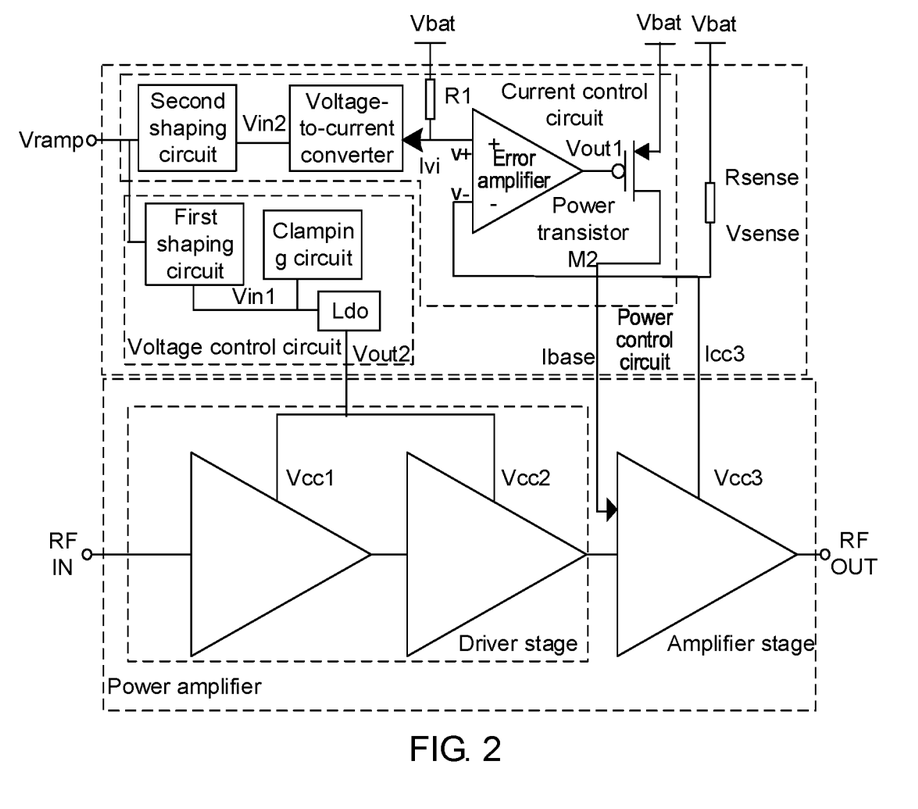
FIG. 2 is a schematic diagram showing a circuit structure of a power amplifier circuit according to a first embodiment of the disclosure.

FIG. 2 is a schematic diagram showing a circuit structure of a power amplifier circuit according to a first embodiment of the disclosure.

As shown in FIG. 2, a power control circuit provided by the embodiment of the disclosure includes a voltage control circuit and a current control circuit. The voltage control circuit is configured to detect an inputted output power control signal Vramp, convert the output power control signal Vramp into a control voltage Vout2, and output the control voltage Vout2 to a driver stage of a power amplifier connected to the power control circuit. The current control circuit is configured to detect the inputted output power control signal Vramp, convert the output power control signal Vramp into a control current Ibase, and output the control current Ibase to an amplifier stage of the power amplifier.

In the related art, a collector of a power transistor M1 is connected to a collector of the power amplifier to supply a control voltage to the power amplifier. The current through the power transistor M1 is relatively large. In the embodiment of the disclosure, a power transistor M2 only needs to supply a small bias current to the power amplifier. Therefore, the power control circuit in the embodiment of the disclosure does not require a large-area power transistor, and the area of the power control circuit is reduced. In addition, the power control circuit in the embodiment of the disclosure separately controls the driver stage and the amplifier stage of the power amplifier, and thus has a greater design freedom.

In the embodiment of the disclosure, the control voltage Vout2 is output to each driver stage of the power amplifier including at least one driver stage. As shown in FIG. 2, the power amplifier has two driver stages, the control voltage Vout2 is output to collectors of the two driver stages of the power amplifier as collector voltages Vcc1 and Vcc2, but it is not limited thereto in practical applications, and the power amplifier may have one or more driver stages.

Figure 4:
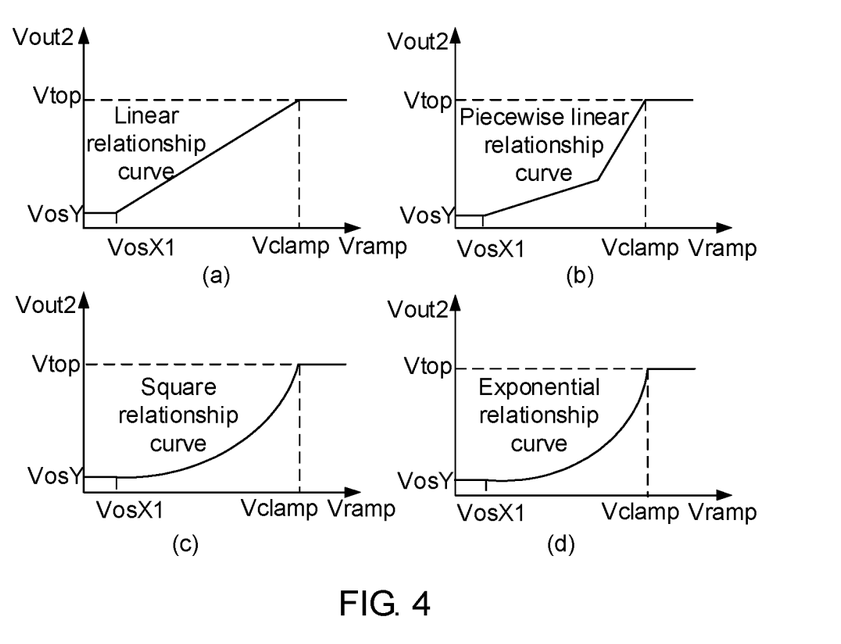
FIG. 4 is a schematic diagram showing a relationship between an output voltage and an input voltage of a voltage control circuit according to an embodiment of the disclosure.

As shown in FIG. 2, the voltage control circuit includes a first shaping circuit configured to convert the output power control signal Vramp into the control voltage Vout2, and a regulator Ldo. The regulator Ldo is a low dropout regulator. As shown in FIG. 4, the first shaping circuit performs starting point drift on a voltage output value with respect to the output power control signal Vramp, that is, when the output power control signal Vramp is less than a set first voltage value VosX1, the voltage output value is shifted to a set second voltage value VosY, such that the amplifier output power meets the PVT requirement.

In the embodiment of the disclosure, the control voltage Vout2 output by the voltage control circuit is positively correlated with a voltage of the inputted output power control signal Vramp when the output power control signal Vramp is greater than a preset first threshold and less than a preset second threshold. As shown in FIG. 4, when the output power control signal Vramp is greater than the set first voltage value VosX1, that is, the first threshold and less than the second threshold Vclamp, the output voltage Vout2 of the voltage control circuit is positively correlated with the input voltage Vramp. Specifically, the output voltage Vout2 of the voltage control circuit shown in FIG. 4(a) is in a linear relationship with the input voltage Vramp; the output voltage Vout2 of the voltage control circuit shown in FIG. 4(b) is in a piecewise linear relationship with the input voltage Vramp; the output voltage Vout2 of the voltage control circuit shown in FIG. 4(c) is in a square relationship with the input voltage Vramp; and the output voltage Vout2 of the voltage control circuit shown in FIG. 4(d) is in an exponential relationship with the input voltage Vramp.

As shown in FIG. 2, the voltage control circuit further includes a clamping circuit configured to perform voltage clamp on the output power control signal when the output power control signal exceeds the preset second threshold, the first shaping circuit and the clamping circuit process the output power control signal Vramp to obtain a voltage Vin1, and the regulator Ldo converts the voltage Vin1 into the control voltage Vout2. As shown in FIG. 4, when the output power control signal Vramp exceeds the second threshold Vclamp, the clamping circuit fixedly outputs a voltage Vtop to make the voltage output value no longer vary with the output power control signal Vramp, thereby ensuring that the output voltage Vout2 of the linear regulator Ldo is within the normal operating voltage range of the driver stage of the power amplifier.

When the power amplifier operates, the voltage of the output power control signal Vramp is converted, in a proportional relationship, into the output voltage Vin1 by the first shaping circuit and the clamping circuit, and the voltage Vin1 is regulated by the regulator Ldo to output the control voltage Vout2 as the operating voltage of the driver stage of the power amplifier. When the voltage of the output power control signal Vramp increases, the control voltage Vout2 increases, the operating voltages Vcc1 and Vcc2 of the driver stage of the power amplifier increase, and the output power for driving the power amplifier increases. When the output power control signal Vramp decreases, the operating voltages Vcc1 and Vcc2 of the driver stage of the power amplifier decrease, and the output power for driving the power amplifier increases accordingly.

As shown in FIG. 2, the current control circuit includes a voltage-to-current converter configured to convert the output power control signal Vramp into a first output current Ivi, and an error amplifier and a power transistor M2 configured to convert the first output current Ivi into a control current Ibase.

Figure 5:
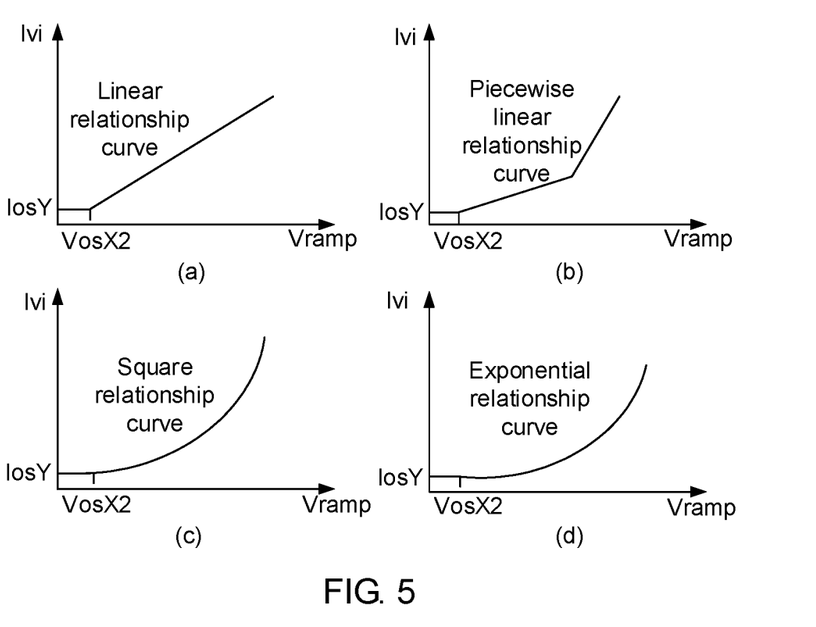
FIG. 5 is a schematic diagram showing a relationship between an output current and an input voltage of a voltage-to-current converter according to an embodiment of the disclosure.

The first control current Ivi output by the voltage-to-current converter is positively correlated with a voltage of the inputted output power control signal Vramp when the output power control signal Vramp is greater than a preset third threshold. As shown in FIG. 5, the output current Ivi of the voltage-to-current converter is positively correlated with the input voltage Vramp when the output power control signal Vramp is greater than the set third voltage value VosX2. The output current Ivi of the voltage-to-current converter shown in FIG. 5(a) is in a linear relationship with the input voltage VRAMP; the output current Ivi of the voltage-to-current converter shown in FIG. 5(b) is in a piecewise linear relationship with the input voltage Vramp; the output current Ivi of the voltage-to-current converter shown in FIG. 5(c) is in a square relationship with the input voltage Vramp; and the output current Ivi of the voltage-to-current converter shown in FIG. 5(d) is in an exponential relationship with the input voltage Vramp.

As shown in FIG. 2, the current control circuit further includes a second shaping circuit, configured to shape the output power control signal Vramp. As shown in FIG. 5, the second shaping circuit performs starting point drift on an output current with respect to the output power control signal Vramp, that is, when the output power control signal Vramp is less than a set third voltage value VosX2, the current output value Ivi is shifted to a set current value IosY, such that the amplifier output power meets the PVT requirement.

When the power amplifier operates, a collector current Icc3 of the amplifier stage of the power amplifier is converted, by a resistor Rsense, into a voltage signal inputted to a negative input V− of the error amplifier, and the current Ivi positively correlated with the output power control signal Vramp is converted, by a resistor R1, into a positive input voltage V+ of the error amplifier. Due to the virtual short characteristic of the error amplifier, the negative input changes as the change of the positive input.

When the voltage of the output power control signal Vramp increases, the output current Ivi of the voltage-to-current converter increases, the positive input voltage V+ of the error amplifier decreases, the negative input voltage V− decreases as V+ decreases, the output voltage Vout1 of the error amplifier decreases, and the output current Ibase of the power transistor M2 increases. Meanwhile, the voltage drop Vsense on the resistor Rsense decreases, so that the collector current Icc3 of the amplifier stage of the power amplifier increases, and the output power of the power amplifier increases. When the output power control signal Vramp decreases, the negative input voltage V− of the error amplifier decreases, the output voltage Vout1 of the error amplifier increases, the output current Ibase of the power transistor M2 decreases, the collector current Icc3 of the amplifier stage of the power amplifier decreases, and the output power of the power amplifier decreases.

As shown in FIG. 2, in the embodiment of the disclosure, the power control circuit further includes a resistor Rsense. One end of the resistor Rsense is connected to a power supply, and the other end of the resistor is connected to a negative input of the error amplifier and a collector of the amplifier stage of the power amplifier.

The collector current Icc3 is large when the power amplifier has a large output power, and Rsense is directly connected in series to the collector of the amplifier stage of the power amplifier, thus the amplifier efficiency is affected. In order to reduce the energy consumption on the Rsense, the value of the resistor Rsense is generally less than 100 milliohms. The resistor Rsense may be embodied by wires on a substrate, binding wires, and wires on a chip. The magnitude of efficiency reduction of the power amplifier caused by the resistor Rsense is less than the magnitude of efficiency reduction of the power amplifier caused by the voltage control method in the related art.

According to the power control circuit provided by the embodiments of the disclosure, an input power control signal is converted into a control voltage Vout2 and a control current Ibase respectively using a voltage control circuit and a current control circuit, and the control voltage and the control current are output respectively to a driver stage and an amplifier stage of a power amplifier so that the power amplifier is controlled to implement its radio frequency amplification function. The performance of the power amplifier circuit is improved compared with the conventional art.

On the basis of the first embodiment, a second embodiment of the disclosure provides a power amplifier circuit.

Figure 3:
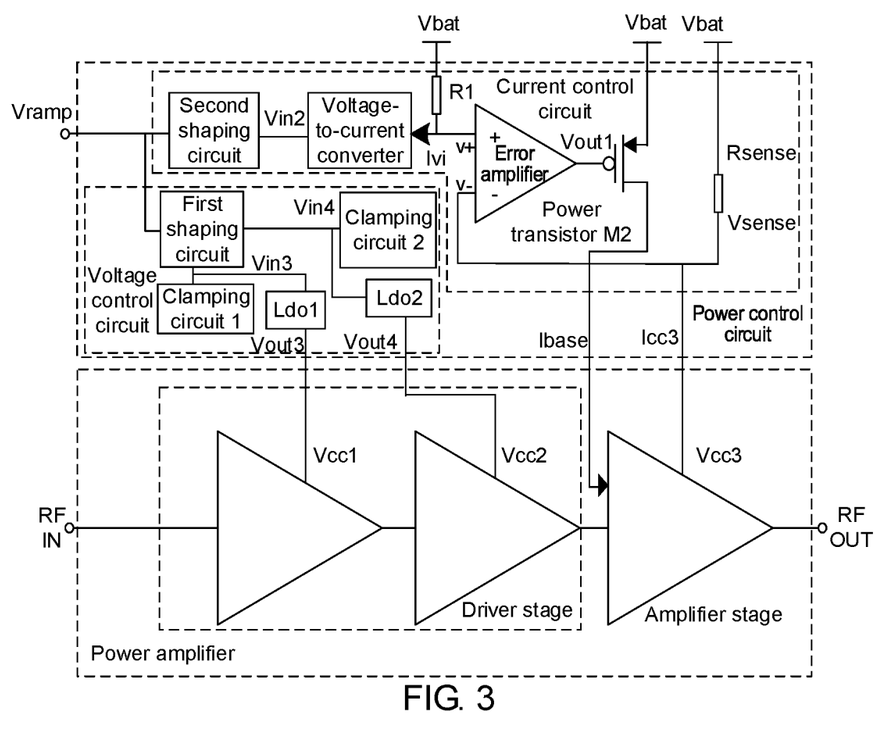
FIG. 3 is a schematic diagram showing a circuit structure of a power amplifier circuit according to a second embodiment of the disclosure.

As shown in FIG. 3, a power control circuit provided by the embodiment of the disclosure includes a voltage control circuit and a current control circuit. The voltage control circuit is configured to detect an inputted output power control signal Vramp, convert the output power control signal Vramp into control voltages Vout3 and Vout4, and output the control voltages Vout3 and Vout4 to a driver stage of a power amplifier connected to the power control circuit. The current control circuit is configured to detect the inputted output power control signal Vramp, convert the output power control signal Vramp into a control current Ibase, and output the control current Ibase to an amplifier stage of the power amplifier.

In the embodiment of the disclosure, the control voltage is output to each driver stage of the power amplifier including at least one driver stage. As shown in FIG. 3, the power amplifier has two driver stages, the control voltages Vout3 and Vout4 are output to collectors of the two driver stages of the power amplifier respectively as collector voltages Vcc1 and Vcc2, but it is not limited thereto in practical applications, and the power amplifier may have one or more driver stages.

As shown in FIG. 3, the voltage control circuit includes a first shaping circuit configured to convert the output power control signal Vramp into the control voltages Vout3 and Vout4, and a regulator. The regulator includes a regulator Ldo1 and a regulator Ldo2, the regulator Ldo1 outputs a control voltage Vout3, the regulator Ldo2 outputs a control voltage Vout4, and both the regulators Ldo1 and Ldo2 are low dropout regulators.

In the embodiment of the disclosure, the control voltages Vout3 and Vout4 output by the voltage control circuit are positively correlated with a voltage of the inputted output power control signal Vramp when the output power control signal Vramp is greater than a preset first threshold and less than a preset second threshold.

As shown in FIG. 3, the voltage control circuit further includes a clamping circuit 1 and a clamping circuit 2 configured to perform voltage clamp on the output power control signal when the output power control signal exceeds the preset second threshold, the first shaping circuit and the clamping circuit 1 process the output power control signal Vramp to obtain a voltage Vin3, and the regulator Ldo1 converts the voltage Vin3 into a control voltage Vout3, and the first shaping circuit and the clamping circuit 2 process the output power control signal Vramp to obtain a voltage Vin4, and the regulator Ldo2 converts the voltage Vin4 into a control voltage Vout4.

When the output power control signal Vramp exceeds the set threshold, the clamping circuit fixedly outputs a voltage to make the voltage output value no longer vary with the output power control signal Vramp, thereby ensuring that the output voltage of the linear regulator is within the normal operating voltage range of the driver stage of the power amplifier.

The functions of the clamping circuit 2 and the clamping circuit 3 in the embodiment of the disclosure may also be implemented by the same clamping circuit. Then, the first shaping circuit and the clamping circuit process the output power signal Vramp to obtain voltages inputted to the regulators Ldo1 and Ldo2.

During the operation of the power amplifier, when the voltage of the output power control signal Vramp increases, the control voltages Vout3 and Vout4 increase, the operating voltages Vcc1 and Vcc2 of the driver stage of the power amplifier increase, and the output power for driving the power amplifier increases. When the output power control signal Vramp decreases, the operating voltages Vcc1 and Vcc2 of the driver stage of the power amplifier decrease, and the output power for driving the power amplifier increases accordingly.

According to the power control circuit provided by the embodiments of the disclosure, an input power control signal is converted into a control voltage and a control current Ibase respectively using a voltage control circuit and a current control circuit, and the control voltage and the control current are output respectively to a driver stage and an amplifier stage of a power amplifier so that the power amplifier is controlled to implement its radio frequency amplification function. The performance of the power amplifier circuit is improved compared with the conventional art.

A third embodiment of the disclosure also provides a power amplifier circuit.

The power amplifier circuit includes a power amplifier and a power control circuit. The power control circuit is connected to the power amplifier, and configured to input a control voltage and a control current Ibase to the power amplifier. The power amplifier is configured to amplify an inputted radio frequency signal according to the control voltage and the control current Ibase, and then output the amplified radio frequency signal.

Here, the power control circuit may adopt the composition and function of the power control circuit described in the above technical solution. For example, a power control circuit as shown in FIG. 2 may be adopted, specifically:

The voltage control circuit receives an inputted output power control signal Vramp, converts the output power control signal Vramp into a control voltage Vout2 by a first shaping circuit and a linear regulator, and inputs the control voltage Vout2 to a driver stage of a power amplifier; the current control circuit receives the inputted output power control signal Vramp, converts the output power control signal Vramp into a control current Ibase by a voltage-to-current converter, an error amplifier and a power transistor, and then inputs the control current Ibase to an amplifier stage of the power amplifier; and under the control of the control voltage Vout2 and the control current Ibase, the power amplifier proportionally amplifies a radio frequency signal received by a radio frequency input RF IN and outputs it from a radio frequency output end RF OUT.

According to the power amplifier circuit provided by the embodiments of the disclosure, an input power control signal is converted into a control voltage and a control current Ibase respectively using a voltage control circuit and a current control circuit, and the control voltage and the control current are output respectively to a driver stage and an amplifier stage of a power amplifier so that the power amplifier is controlled to implement its radio frequency amplification function. The performance of the power amplifier circuit is improved compared with the conventional art.

The above is only the preferred embodiment of the disclosure and is not intended to limit the scope of the disclosure.

According to the power control circuit and the power amplifier circuit provided by the embodiments of the disclosure, an input power control signal is converted into a control voltage and a control current respectively using a voltage control circuit and a current control circuit, and the control voltage and the control current are output respectively to a driver stage and an amplifier stage of a power amplifier so that the power amplifier is controlled to implement its radio frequency amplification function. Compared with related art, the collector current of the power transistor M1 reduces and the performance of the power amplifier circuit is improved.

The invention claimed is:

1. A power control circuit, comprising a voltage control circuit and a current control circuit,
   wherein the voltage control circuit is configured to detect an inputted output power control signal, convert the output power control signal into a control voltage, and output the control voltage to a driver stage of a power amplifier connected to the power control circuit; the control voltage is output to each driver stage of the power amplifier comprising at least one driver stage; and the voltage control circuit comprises a first shaping circuit and a voltage regulator, the first shaping circuit and the voltage regulator being configured to convert the output power control signal into the control voltage; and
   wherein the current control circuit is configured to detect, through a second shaping circuit and a voltage-to-current converter, the inputted output power control signal, convert the output power control signal into a control current, and output the control current to an amplifier stage of the power amplifier.

2. The power control circuit according to claim 1, wherein the control voltage output by the voltage control circuit is positively correlated with a voltage of the inputted output power control signal when the output power control signal is greater than a preset first threshold and less than a preset second threshold.

3. The power control circuit according to claim 2, wherein the voltage control circuit further comprises a clamping circuit, configured to perform voltage clamp on the output power control signal when the output power control signal exceeds the preset second threshold.

4. The power control circuit according to claim 1, wherein the current control circuit comprises the voltage-to-current converter, an error amplifier and a power transistor,
   wherein the voltage-to-current converter is configured to convert an input voltage into a first output current; and wherein the error amplifier and the power transistor are configured to convert the first output current into the control current.

5. The power control circuit according to claim 4, wherein the first control current output by the voltage-to-current converter is positively correlated with a voltage of the inputted output power control signal when the output power control signal is greater than a preset third threshold.

6. The power control circuit according to claim 4, wherein the current control circuit further comprises the second shaping circuit, configured to shape the output power control signal.

7. The power control circuit according to claim 4, further comprising a resistor, wherein one end of the resistor is connected to a power supply, and another end of the resistor is connected to a negative input of the error amplifier.

8. The power control circuit according to claim 1, wherein the current control circuit comprises the voltage-to-current converter, an error amplifier and a power transistor,
wherein the voltage-to-current converter is configured to convert an input voltage into a first output current; and
wherein the error amplifier and the power transistor are configured to convert the first output current into the control current.

9. A power amplifier circuit, comprising a power amplifier and a power control circuit, the power control circuit comprising a voltage control circuit and a current control circuit;
wherein the voltage control circuit is configured to detect an inputted output power control signal, convert the output power control signal into a control voltage, and output the control voltage to a driver stage of a power amplifier connected to the power control circuit; the control voltage is output to each driver stage of the power amplifier comprising at least one driver stage; and the voltage control circuit comprises a first shaping circuit and a voltage regulator, the first shaping circuit and the voltage regulator being configured to convert the output power control signal into the control voltage; and
wherein the current control circuit is configured to detect, through a second shaping circuit and a voltage-to-current converter, the inputted output power control signal, convert the output power control signal into a control current, and output the control current to an amplifier stage of the power amplifier;
wherein the power control circuit, connected to the power amplifier, is configured to input the control voltage and the control current to the power amplifier; and
wherein the power amplifier is configured to amplify an inputted radio frequency signal according to the control voltage and the control current, and output the amplified radio frequency signal.

10. The power amplifier circuit according to claim 9, wherein the control voltage output by the voltage control circuit is positively correlated with a voltage of the inputted output power control signal when the output power control signal is greater than a preset first threshold and less than a preset second threshold.

11. The power amplifier circuit according to claim 10, wherein the voltage control circuit further comprises a clamping circuit, configured to perform voltage clamp on the output power control signal when the output power control signal exceeds the preset second threshold.

12. The power amplifier circuit according to claim 11, wherein the current control circuit comprises the voltage-to-current converter, an error amplifier and a power transistor,
wherein the voltage-to-current converter is configured to convert an input voltage into a first output current; and
wherein the error amplifier and the power transistor are configured to convert the first output current into the control current.

13. The power amplifier circuit according to claim 12, wherein the first control current output by the voltage-to-current converter is positively correlated with a voltage of the inputted output power control signal when the output power control signal is greater than a preset third threshold.

14. The power amplifier circuit according to claim 13, wherein the current control circuit further comprises the second shaping circuit, configured to shape the output power control signal.

15. The power amplifier circuit according to claim 14, further comprising a resistor, wherein one end of the resistor is connected to a power supply, and another end of the resistor is connected to a negative input of the error amplifier.

* * * * *